(12) United States Patent
Kimura

(10) Patent No.: US 7,271,035 B2
(45) Date of Patent: Sep. 18, 2007

(54) MANUFACTURING METHOD FOR RESIN SEALED SEMICONDUCTOR DEVICE

(75) Inventor: Noriyuki Kimura, Chiba (JP)

(73) Assignee: Seiko Instruments Inc. (JP)

( * ) Notice: Subject to any disclaimer, the term of this patent is extended or adjusted under 35 U.S.C. 154(b) by 274 days.

(21) Appl. No.: 11/031,267

(22) Filed: Jan. 7, 2005

(65) Prior Publication Data
US 2005/0158917 A1    Jul. 21, 2005

(30) Foreign Application Priority Data
Jan. 13, 2004    (JP)    ............................ 2004-005011

(51) Int. Cl.
*H01L 21/00*    (2006.01)
(52) U.S. Cl. ..................... 438/123; 438/124
(58) Field of Classification Search ................ 257/666, 257/676, 787; 438/106, 123, 124, 112, 127
See application file for complete search history.

(56) References Cited

U.S. PATENT DOCUMENTS 6,380,048 B1 *    4/2002   Boon et al. ................. 438/456
6,420,779 B1 *    7/2002   Sharma et al. .............. 257/666
7,109,572 B2 *    9/2006   Fee et al. .................... 257/672

* cited by examiner

*Primary Examiner*—Roy Potter
(74) *Attorney, Agent, or Firm*—Adam & Wilks

(57) ABSTRACT

A semiconductor device manufacturing method comprises etching a front side of a conductive board to form plural sets of a die pad portion and bonding areas, each set corresponding to one semiconductor device. Semiconductor chips are mounted on respective ones of the die pad portions using conductive paste. Electrodes of the respective semiconductor chips are electrically connected with metal wires to the bonding areas, and then the front side of the conductive board, including the semiconductor chips, the bonding areas and the metal wires, are sealed with a molding resin to form a resin-sealed body. Thereafter, the whole back side of the conductive board is removed to a depth sufficient to expose the die pad portions and the bonding areas. Then the resin-sealed body is separated into individual semiconductor devices.

16 Claims, 5 Drawing Sheets

MANUFACTURING METHOD FOR RESIN SEALED SEMICONDUCTOR DEVICE

BACKGROUND OF THE INVENTION

1. Field of the Invention

The present invention relates to a method of manufacturing a semiconductor device in which a semiconductor chip is sealed. In particular, the invention relates to a method of manufacturing a leadless, resin sealed semi-conductor device, which can also be made small and thin capable of achieving smallness and slimness.

2. Description of the Related Art

A conventional semiconductor device, especially a leadless, resin sealed semiconductor device, is manufactured in such a manner that a semiconductor chip mounted on a surface of a printed circuit board made of glass epoxy, ceramic, or the like and a plurality of connecting electrodes formed on the surface of the printed circuit board are electrically connected to each other by metal wires, and an electrode layer formed on the other surface of the printed circuit board so as to oppose the connecting electrodes and the respective connecting electrodes are electrically connected to each other via a conductive material disposed in a through hole. Then, the semiconductor device is structured by sealing the semiconductor chip with epoxy resin or the like.

Alternatively, instead of using the printed circuit board made of glass epoxy, ceramic, or the like, a semiconductor device is manufactured through the following another procedure. A conductive metal is electrodeposited on a board whose surface is conductive and partly masked by resist to form a metal layer for mounting a semiconductor chip and board electrodes separately. After the semiconductor chip is mounted on the metal layer, electrodes on the semiconductor chip and the board electrodes are electrically connected to each other, a mounting portion for the semiconductor chip is sealed with a resin layer on the circuit board, and the board is peeled off, thereby obtaining a resin sealed body having a rear surface of the metal layer and that of the board electrodes exposed (for example, refer to JP 2002-9196 A (FIGS. 10 and 2)).

In the first manufacturing procedure of the semiconductor device, however, precision in position is demanded during the manufacture. The connecting electrodes on one surface of the printed circuit board and the electrode layer on the other surface should be accurately placed in position on both sides of the printed circuit board. In addition, secure electrical contact between the electrodes and the electrode layer should be made via through-holes without positional displacement. The demand for precision becomes a bottleneck for reduction in manufacturing costs together with increase in the number of manufacturing steps for formation of the through-holes and conductor printing on the printed circuit board, and it also becomes necessary to assign a certain area for forming the throughholes between multiple semiconductor chips which are arranged adjacent to each other on the printed circuit board. Further, a limitation is placed on the number of the semiconductor devices to be arranged and formed on one printed circuit board. Moreover, since resin sealing is conducted on the relatively thick printed circuit board to which semiconductor chips are mounted in this manufacturing method, the presence of the printed circuit board itself hinders smallness and slimness of the semiconductor device, and heat generated by the operation of the semiconductor chips easily tends to accumulate in the circuit board itself. The semiconductor device thus also has insufficient heat dissipation property.

In addition, the second manufacturing procedure involves peeling off the bonding between the molding resin and the board to expose the electrodeposition layer made of the conductive metal in forming external connecting electrodes. The electrodeposition layer is thus pulled by the board upon the peeling. Consequently, terminal strength is reduced in some cases, which means that the manufacturing method has an unwanted potential leading to lowering yield of the semiconductor device and reduction in reliability during device packaging.

SUMMARY OF THE INVENTION

The present invention has been proposed to solve the above-mentioned problems and an object of the invention is to provide a method of manufacturing a small and slim leadless semiconductor device, with which excellent mass productivity and package reliability can be attained and manufacturing cost can be reduced.

The present invention is a semiconductor device manufacturing method, including the steps of: conducting half etching on one surface side of a conductive board to form a die pad portion and bonding areas; mounting a semiconductor chip on the die pad portion using a conductive paste; electrically connecting electrodes on the semiconductor chip and the bonding areas to each other; sealing a mounting portion of the semiconductor chip with a molding resin on the conductive board; gradually removing a rear side of the conductive board and exposing the die pad portion and the bonding areas to allow the bonding areas to function as external connecting electrodes to obtain resin sealed bodies; and separating the resin sealed body into individual semiconductor device. A semiconductor device which can solve the above-mentioned problems can thus be manufactured.

According to the present invention, the conductive board is subjected to half etching, whereby the die pad portion for mounting a semiconductor chip and the bonding areas (external connecting electrodes) are simultaneously formed. After the semiconductor chip is mounted, the electrodes on the semiconductor chip and the electrode layer on the conductive board are electrically connected to each other. Then, the chip mounted portion is sealed with resin, and the conductive board is gradually removed through grinding (polishing) from the rear surface of the conductive board. Thus, only the die pad portion and the bonding areas (external connecting electrodes) are exposed. With the above procedure, the semiconductor device is manufactured. Accordingly, an expensive printed circuit board made of glass epoxy or the like is not used for apart constituting the semiconductor device, and it is therefore possible to reduce material cost and processing cost and realize small and slim package. In addition, heat generated by the operation of the semiconductor chip hardly accumulates in the board itself, and the heat from the semiconductor chip directly dissipates through the assemble board, thus excellent heat dissipation properties is obtained as well.

Further, according to the present invention a peeling-off force does not act on the electrodeposition layer and no degradation on terminal strength is caused when the external connecting electrodes are formed, since the conductive board is subjected to grinding, polishing, or etching process to form the die pad portion and the external connecting electrodes. Thus, yield for the semiconductor device manufacturing and reliability during packaging can be improved. Moreover, in a case where grinding or polishing process is performed, deviation in terminal flatness is made small, mountability becomes high, and an entire semiconductor device thickness can also be controlled with excellent precision.

DETAILED DESCRIPTION OF THE PREFERRED EMBODIMENTS

Hereinafter, embodiments of the present invention will be described in order.

First Embodiment

Figure 1A:
FIGS. 1A to 1G are cross-sectional views and top views for explaining a manufacturing process for a semiconductor device according to a first embodiment of the present invention.
Figure 1B:
Figure 1B:
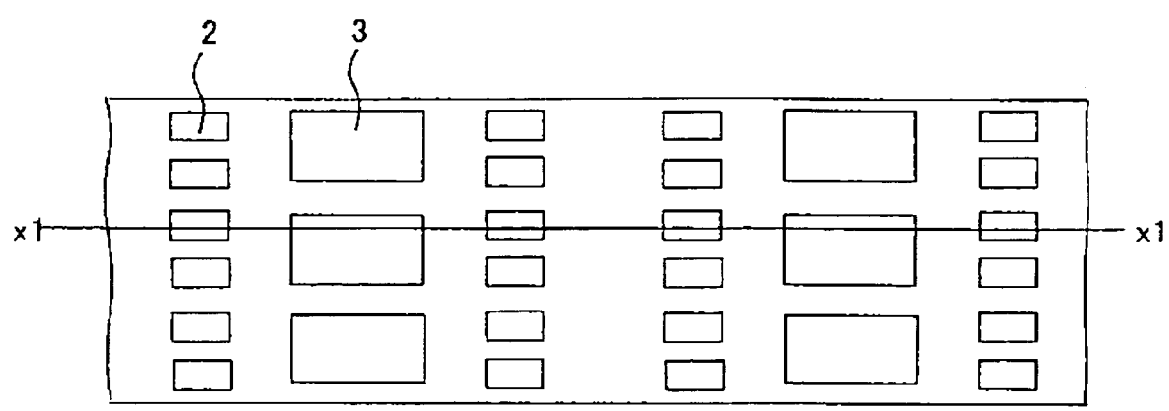

FIGS. 1A to 1G are diagrams showing manufacturing step for a semiconductor device according to the first embodiment of the present invention. Shown in FIG. 1A is a conductive metal board 1 having opposed front and back sides and made of copper, Fe-42% Ni or the like. In this embodiment, a copper plate having a thickness of 0.2 mm is chosen as the metal board 1. The front side of the metal board 1 is half etched into a prescribed pattern to have die pad portions 3 and bonding areas 2 each having an about 0.10 mm step portion on the front side of the copper plate as shown in FIG. 1B (the upper diagram of FIG. 1B is a cross sectional view taken along the line x1-x1, and the lower diagram thereof is a top view).

Figure 1C:
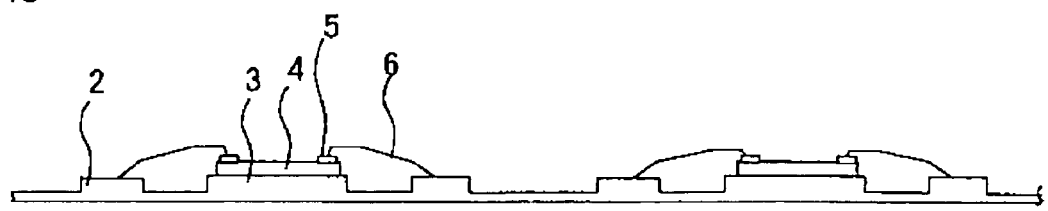

Then, as shown in FIG. 1C, after a semiconductor chip 4 is mounted on the respective die pad portion 3 of the conductive metal board 1 with a bonding layer made of an Ag epoxy paste or the like, electrodes 5 on the respective semiconductor chip 4 and the bonding area 2 are electrically connected to each other using metal wires 6 such as gold wires by means of an ultrasonic wire bonding device or the like.

Figure 1D:
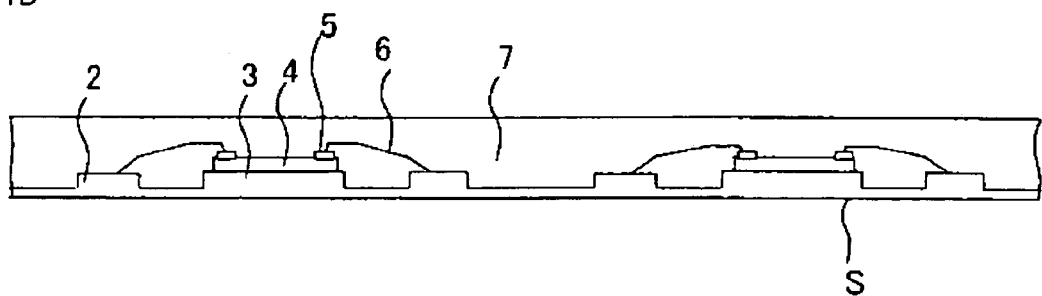

Then, mounting portions of the semiconductor chips 4 on the conductive circuit board 1 are sealed with a molding resin 7 such as epoxy resin through transfer molding or potting as shown in FIG. 1D, thereby forming a resin sealed body. That is, a plurality of the semiconductor chips 4 is continuously sealed with the molding resin 7 on the metal board 1. It should be noted that in a case of transfer molding, two to four of the metal boards 1 are arranged in parallel, and molding resin is inserted under pressure between the metal boards 1 and an upper mold through a runner, making it possible to efficiently conduct plural resin sealing at once.

Figure 1E:
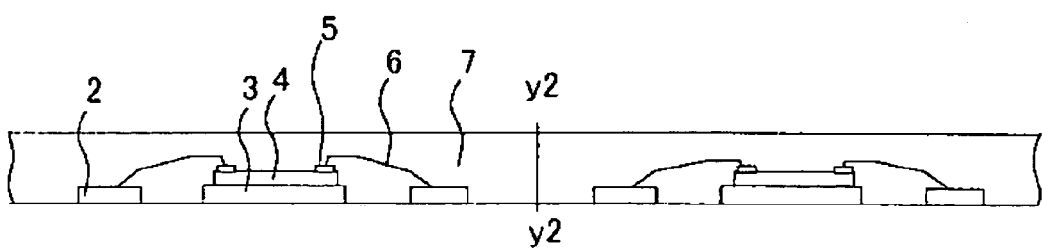

Then, after the resin sealed body is attached to a tape for back grinding or the like as shown in FIG. 1E when needed, a device such as a back grinder is employed to conduct a grinding or polishing process gradually and evenly on a the metal exposed surface of the back side S until only the plural die pad portions 3 and bonding areas 2 (external connecting electrodes) are exposed to a bottom surface of the resin sealed body, i.e., the whole back side of the metal board 1 is removed to a depth sufficient to expose the die pad portions 3 and the bonding areas 2. Instead of conducting grinding or polishing process, when etching is performed on the metal exposed surface to allow only the die pad portions 3 and the bonding areas 2 (external connecting electrodes) to be exposed, the above-mentioned effect can be attained. It should be noted that after this step is ended, a thin film for assembly, which is made of a conductive metal such as gold, silver, or nickel, may be formed through plating on each of exposed portions of the die pad portions 3 and the external connecting electrodes. Also, solder (ball) may be formed on the die pad portions 3 and the external connecting electrode portions through solder printing.

Figure 1F:
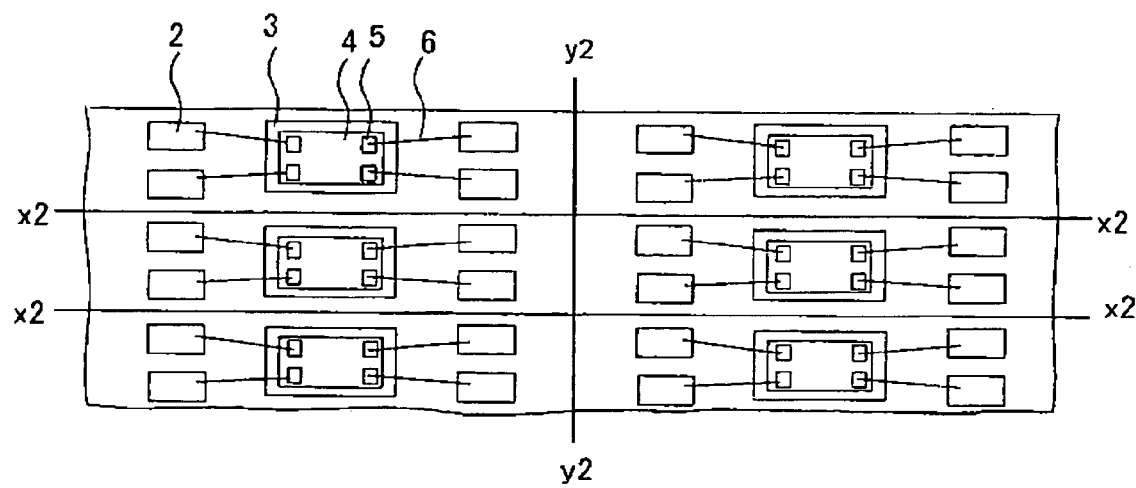
Figure 1G:
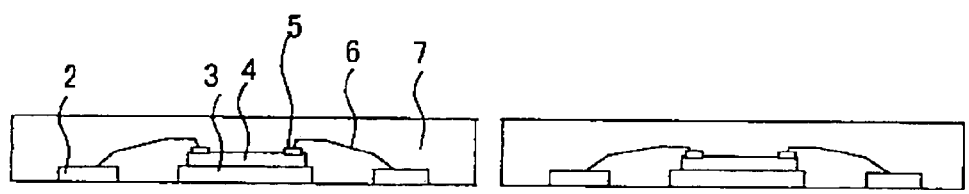

Then, after a step of dicing for cutting to pieces is performed on the resin sealed body shown in FIG. 1F along the cutting lines x2-x2 and y2-y2, the separate semiconductor devices as shown in FIG. 1G are completed.

Second Embodiment

Figure 2A:
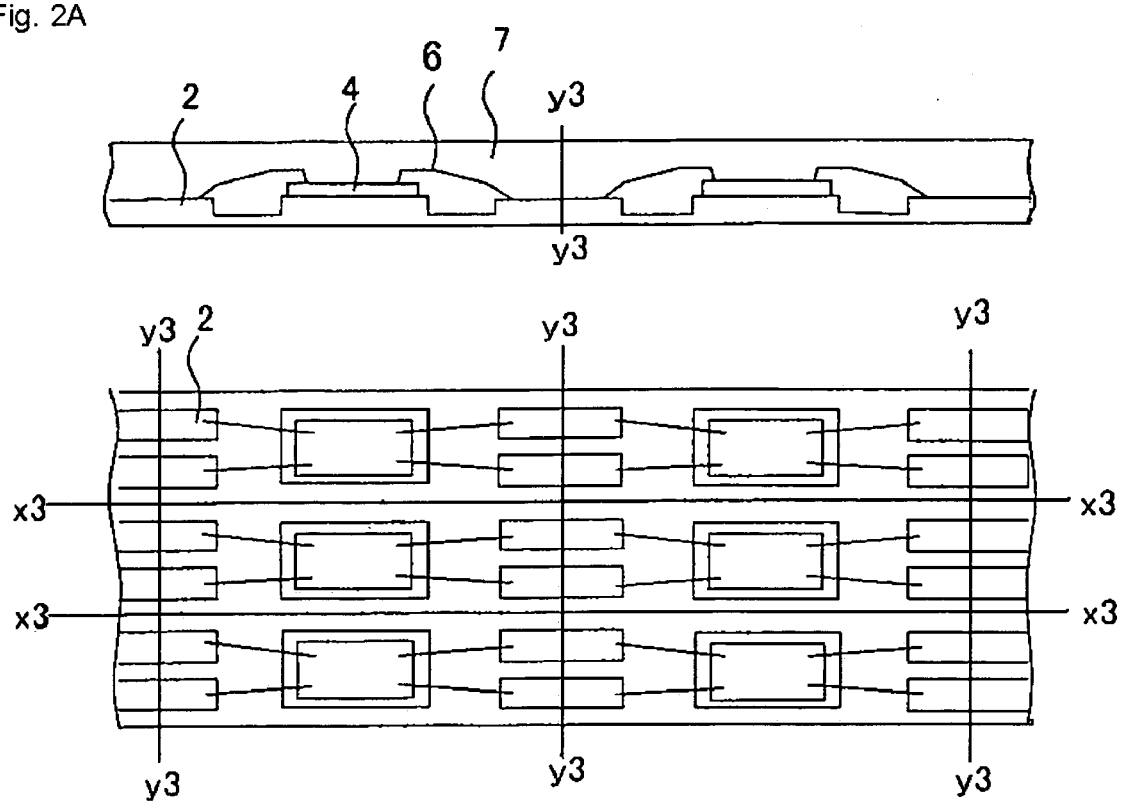
FIGS. 2A and 2B are cross-sectional views and a top view for explaining a manufacturing process for a semiconductor device according to a second embodiment of the present invention.
Figure 2B:
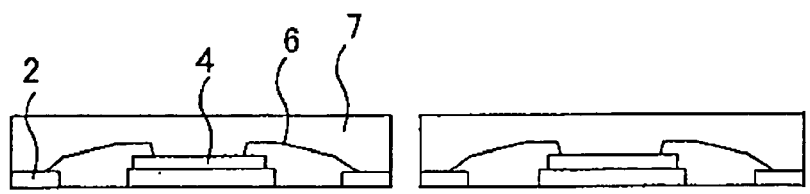

FIGS. 2A and 2B show the second embodiment of the present invention. As shown in FIG. 2A, the metal wires 6 are connected to the respective semiconductor chips 4 on which the bonding areas are mounted on the left and right side thereof as the common bonding areas 2. After carrying out the sealing with the molding resin 7, the bonding areas 2 are cut at a center portion such that dicing is conducted along the cutting lines x3-x3 and y3-y3. As shown in FIG. 2B, the semiconductor devices are cut and separated, thus producing complete products. In this case, arrangement of the bonding areas (external connecting electrodes) on the metal board 1 is efficiently performed such that the bonding areas are made closer to each other in position. The small-sized semiconductor device is therefore realized and also the number of devices available from one board can be increased. As a result, it is possible to manufacture the semiconductor devices at low costs.

Third Embodiment

Figure 3A:
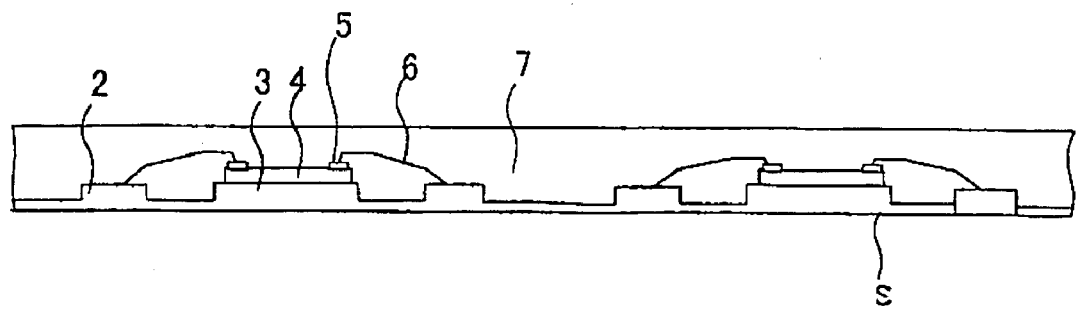
FIGS. 3A to 3C are cross-sectional views for explaining a manufacturing process for a semiconductor device according to a third embodiment of the present invention.
Figure 3B:
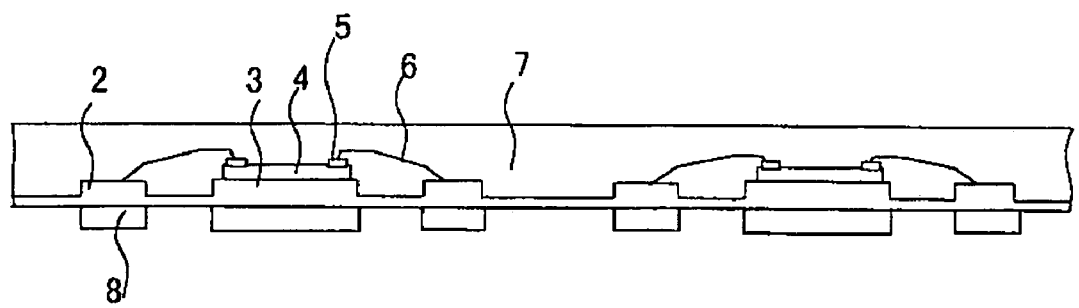
Figure 3C:
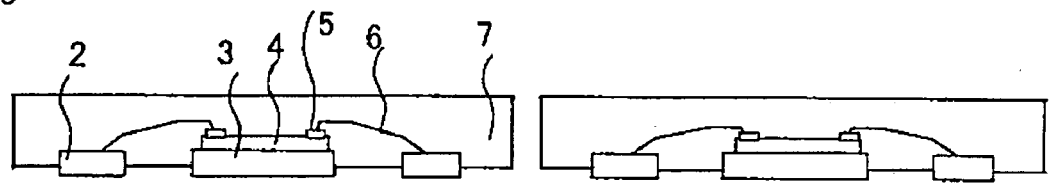

FIGS. 3A to 3C show the third embodiment of the present invention. The manufacturing procedure is similar to that of the first embodiment up to carrying out the sealing with the molding resin. According to the third embodiment, in a step of removing the metal exposed surface side S of the metal board 1 shown in FIG. 3A, after a photo-resist 8 is applied on the die pad portions 3 and the bonding areas 2, patterning and etching process are performed. Thus, a desired portion of the metal board 1 is removed, thereby forming the die pad portions 3 and the external connecting electrodes as shown in FIG. 3B. The final form after the dicing is as shown in FIG. 3C.

As has been described above, according to the present invention, a printed circuit board conventionally used for a part constituting a semiconductor device is no longer necessarily used, suppressing the material cost and the process cost. Also, it is possible to realize the smallness, in particular, slimness of the semiconductor device itself. Further, since such a mode is adopted that the die pad portions for mounting the semiconductor chips are exposed from the resin layer rear surface, the heat generated in the semiconductor chips directly dissipates through the mounting circuit board, leading to excellent heat dissipation properties. Moreover, in the step of forming the die pad portions or the external connecting electrode portions, the respective portions are formed through exposure by means of grinding, polishing, or etching, thus eliminating the necessity of peeling off the circuit board from the electrodeposition layer as in an electro-casting semiconductor device. Hence, the terminal strength will not be degraded. Consequently, assembly yield and package reliability of the semiconductor device are improved.

What is claimed is:

1. A semiconductor device manufacturing method, comprising the steps of:
    providing a conductive board having opposed front and back sides;
    conducting half etching of the front side of the conductive board to form a die pad portion and bonding areas on the conductive board;
    mounting a semiconductor chip on the die pad portion using a conductive paste;
    connecting electrodes on the semiconductor chip and the bonding areas to each other electrically with metal wires;
    sealing a mounting portion of the semiconductor chip, the bonding areas and the front side of the conductive board with a molding resin to form a resin sealed body; and
    removing the whole back side of the conductive board to a depth sufficient to expose the die pad portion and the bonding areas.

2. A semiconductor device manufacturing method, comprising the steps of:
    providing a conductive board having opposed front and back sides;
    conducting half etching of the front side of the conductive board to form a plurality of sets of a die pad portion and bonding areas on the conductive board;
    mounting a semiconductor chip on the die pad portion of each set using a conductive paste;
    connecting electrodes on the respective semiconductor chips and the bonding areas of the respective sets to each other electrically with metal wires;
    sealing a mounting portion of each semiconductor chip, the bonding areas connected thereto and the front side of the conductive board with a continuous molding resin to form a resin sealed body;
    removing the whole back side of the conductive board to a depth sufficient to expose the die pad portion and the bonding areas of each set; and
    separating the resin sealed body into individual semiconductor devices.

3. A semiconductor device manufacturing method according to claim 2, wherein the conductive board is made of a metal including one of copper and Fe-42% Ni.

4. A semiconductor device manufacturing method according to claim 2, wherein the step of electrically connecting the electrodes on the semiconductor chip and the bonding areas to each other includes wire bonding using one of a gold wire, a copper wire, and an aluminum wire.

5. A semiconductor device manufacturing method according to claim 2, wherein the step of sealing the mounting portion with the molding resin includes one of potting and transfer molding.

6. A semiconductor device manufacturing method according to claim 2, wherein the step of removing the whole back side of the conductive board to expose the die pad portion and the bonding areas of each set includes one of grinding or polishing using a back grinding device and etching.

7. A semiconductor device manufacturing method according to claim 2, wherein the step of separating the resin sealed body into individual semiconductor devices includes dicing.

8. A semiconductor device manufacturing method according to claim 1, wherein the conductive board is made of a metal including one of copper and Fe-42% Ni.

9. A semiconductor device manufacturing method according to claim 1, wherein the step of electrically connecting the electrodes on the semiconductor chip, and the bonding areas to each other includes wire bonding using one of a gold wire, a copper wire, and an aluminum wire.

10. A semiconductor device manufacturing method according to claim 1, wherein the step of sealing the mounting portion with the molding resin includes one of potting and transfer molding.

11. A semiconductor device manufacturing method according to claim 1, wherein the step of removing the whole back side of the conductive board to expose the die pad portion and the bonding areas includes one of grinding or polishing using a back grinding device and etching.

12. A semiconductor device manufacturing method, comprising the steps of:
    providing a conductive board having opposed front and back sides;
    etching the front side of the conductive board to form plural sets of a die pad portion and bonding areas on the conductive board, each set corresponding to one semiconductor device;
    mounting semiconductor chips having electrodes on respective ones of the die pad portions using conductive paste;
    connecting the electrodes of the respective semiconductor chips to the bonding areas of the respective sets with metal wires;
    sealing the front side of the conductive board including the semiconductor chips, the bonding areas and the metal wires with a molding resin to form a resin-sealed body;
    removing the whole back side of the conductive board to a depth sufficient to expose the die pad portions and the bonding areas of the plural sets; and then
    separating the resin-sealed body into individual semiconductor devices.

13. A semiconductor device manufacturing method according to claim 12; wherein the connecting step comprises wire bonding the electrodes to the bonding areas using one of gold wire, copper wire and aluminum wire.

14. A semiconductor device manufacturing method according to claim 12; wherein the sealing step is carried out using one of potting and transfer molding.

15. A semiconductor device manufacturing method according to claim 12; wherein the removing step is carried out by grinding or polishing.

16. A semiconductor device manufacturing method according to claim 12; wherein the removing step is carried out by etching.

* * * * *